United States Patent [19]

Arase et al.

[11] Patent Number: 5,784,325
[45] Date of Patent: Jul. 21, 1998

[54] SEMICONDUCTOR NONVOLATILE MEMORY DEVICE

[75] Inventors: Kenshiro Arase; Masaru Miyashita, both of Kanagawa, Japan

[73] Assignee: Sony Corporation, Japan

[21] Appl. No.: 779,115

[22] Filed: Jan. 6, 1997

Related U.S. Application Data

[63] Continuation of Ser. No. 499,516, Jul. 7, 1995.

[30] Foreign Application Priority Data

Jul. 25, 1994 [JP] Japan ................................. 6-172956

[51] Int. Cl.$^6$ ...................................................... G11C 11/34
[52] U.S. Cl. .............................. 365/185.18; 365/185.28; 365/185.29
[58] Field of Search .......................... 365/185.18, 185.06, 365/185.13, 185.22, 185.27, 185.28, 185.29

[56] References Cited

U.S. PATENT DOCUMENTS

| | | | |
|---|---|---|---|
| 4,443,718 | 4/1984 | Hagiwara et al. | 365/185.06 |
| 4,627,027 | 12/1986 | Rai et al. | 365/185.06 |
| 4,908,795 | 3/1990 | Tsuchiya et al. | 365/185.06 |
| 5,017,980 | 5/1991 | Gill et al. | 365/185.06 |
| 5,047,981 | 9/1991 | Gill et al. | 365/185.06 |
| 5,177,705 | 1/1993 | McElroy et al. | 365/185.06 |
| 5,229,968 | 7/1993 | Ito et al. | 365/185.06 |
| 5,295,107 | 3/1994 | Okazawa et al. | 365/185.06 |
| 5,313,432 | 5/1994 | Lin et al. | 365/185.06 |
| 5,357,462 | 10/1994 | Tanaka | 365/189.05 |
| 5,361,227 | 11/1994 | Tanaka | 365/189.01 |
| 5,399,891 | 3/1995 | Yiu et al. | 365/185.06 |
| 5,400,287 | 3/1995 | Fuchigami | 365/185.06 |
| 5,402,374 | 3/1995 | Tsuruta et al. | 365/185.06 |
| 5,467,307 | 11/1995 | D'Arrigo et al. | 365/185.06 |

OTHER PUBLICATIONS

A Quick Intelligent Program Architecture For 3V–Only NAND–EPROMS, Tanaka et al, Symposium on VLSI Circuits Digest Of Technical Papers, Feb. 1992.

*Primary Examiner*—A. Zarabian
*Attorney, Agent, or Firm*—Ronald P. Kananen

[57] ABSTRACT

A semiconductor nonvolatile memory device comprised of bit lines and source lines arranged in a hierarchy of main lines and sub-lines, the main lines and the sub-lines being selectively connected in accordance with the operation of the memory device and memory cells being connected in parallel between the sub-source lines and the sub-bit lines, wherein data is written by introducing electrons from the full channel surface to the charge-storage layer by FN tunneling and is erased by drawing out the electrons in the charge-storing layer from the drain side by FN tunneling. Operation is made possible by a single power source and the area of the cell of the full one transistor memory type is made smaller.

10 Claims, 18 Drawing Sheets

FIG. 2

|  | SL | WL | BL | SOURCE |
|---|---|---|---|---|
| ERASE | 0V | 20V | FLOATING | 0V |
| WRITE DATA "1" | 10V | −10V | 6V | FLOATING |
| WRITE DATA "0" | 10V | −10V | 0V | FLOATING |
| READ | 3~5V | 3~5V | 1~2V | 0V |

FIG. 6

|  | SL1 | SL2 | WL | DBL | SOURCE |
|---|---|---|---|---|---|
| ERASE | 0V | 10V | 20V | FLOATING | 0V |
| WRITE DATA "1" | 10V | 0V | −10V | 6V | 0V |
| WRITE DATA "0" | 10V | 0V | −10V | 0V | 0V |
| READ | 3~5V | 3~5V | 3~5V | 1~2V | 0V |

|  | WL1 | WL2 | S1 | D1 | S2 | D2 |
|---|---|---|---|---|---|---|
| ERASE | −11V | −11V | 5V | FLOATING | 3.3V | FLOATING |
| WRITE | 7V | 18V | 0V | FLOATING | 7V | FLOATING |
| READ | 0V | 3.3V | 0V | 1V | 0V | 1V |

FIG. 10

|  | SL1 | SL2 | WL | DBL | SOURCE |
|---|---|---|---|---|---|
| ERASE | 5V | 5V | SELECT −14V<br>NON-SELECT 0V | 3.3V → 0V | 0V |
| WRITE DATA | 22V | 0V | SELECT 22V<br>NON-SELECT 11V | DATA "1" 0V<br>DATA "0" 11V | 0V |
| READ DATA (RAMDOM MODE) | 3.3V | 3.3V | SELECT 3.3V<br>NON-SELECT 0V | SELECT 2V<br>NON-SELECT 0V | 0V |
| READ DATA (PAGE MODE) | 3.3V | 3.3V | SELECT 3.3V<br>NON-SELECT 0V | 2V | 0V |

FIG. 11

|  | SL1 | SL2 | WL | DBL | SOURCE |
|---|---|---|---|---|---|
| ERASE | 5V | 5V | −18V | 0V | 0V |
| WRITE DATA | 22V | 0V | SELECT 22V<br>NON-SELECT 11V | DATA "1" 0V<br>DATA "0" 11V | 0V |
| READ DATA (RAMDOM MODE) | 3.3V | 3.3V | SELECT 3.3V<br>NON-SELECT 0V | SELECT 2V<br>NON-SELECT 0V | 0V |
| READ DATA (PAGE MODE) | 3.3V | 3.3V | SELECT 3.3V<br>NON-SELECT 0V | 2V | 0V |

ERASURE OPERATION – FIRST EXAMPLE

ERASURE OPERATION — SECOND EXAMPLE

DATA WRITE OPERATION

READ OPERATION – RANDOM ACCESS MODE

READ OPERATION – PAGE MODE

SEMICONDUCTOR NONVOLATILE MEMORY DEVICE

This application is a continuation of application Ser. No. 08/499,516 filed Jul. 7, 1995.

BACKGROUND OF THE INVENTION

1. Field of the Invention

The present invention relates to an electrically erasable nonvolatile memory, for example, a flash EEPROM or other semiconductor nonvolatile memory device.

2. Description of the Related Art

In a NOR type flash memory, data is written by injecting electrons into a floating gate from a drain side by the channel hot electron (CHE) effect and is erased by drawing out the electrons in the floating gate from a source side by the Fowler-Nordheim (FN) tunneling phenomenon.

In this operation method, however, since the data is written by the CHE effect, a large current flows between the drain and source sides at the time of writing and therefore operation is not possible by a single power source.

In recent years, however, along with the growth in the market for portable compact electronic devices, a desire has arisen for realization of a NOR type flash memory with an improved random access speed, and which can operate with a single power source (a single battery).

Accordingly, the following have been proposed as NOR type flash memories aimed at performing both the writing and erasing of data by the FN tunneling phenomenon and thereby operation by a single power source (a single battery):

(1) DINOR type flash memory (2) AND type flash memory (3) ACEE type flash memory The configurations, operations, and disadvantages of these three types of flash memories will be explained in detail below.

(1) DINOR Type Flash Memory

FIG. 1 is a view of the configuration of a memory array of a DINOR type flash memory comprised of two groups of eight word lines connected to two main bit lines and sub bit lines.

In the memory array of FIG. 1, WL1m to WL8m and WL1m+1 to WL8m+1 indicate word lines, SLm and SLm+1 selection gate lines, MBLn and MBLn+1 main bit lines, SBLm,n, SBLm+1,n, SBLm,n+1, and SBLm+1,n+1 sub bit lines, SRLm,n, SRLm+1,n, SRLm,n+1, and SRLm+1,n+1 common source lines, MT1m,n to MT8n,n, MT1m,n+1 to MT8m+1,n, MT1m,n+1 to MT8m,n+1, MT1m+1,n+1 to MT8m+1,n+1 memory cell transistors, and STm,n, STm+1,n, STm,n+1, and STm+1,n+1 selection transistors.

FIG. 2 is a view showing the bias conditions for erasure, writing, and reading of the DINOR type flash memory as shown in FIG. 1.

As shown in FIG. 2, the erasure operation in the DINOR type flash memory is performed by applying 0 V to the selection gate line SL and the source of the memory cell transistor MT, applying 20 V to the word line WL, and holding the bit line BL at a floating state to thereby inject electrons into the floating gate.

Data is written by applying 10 V to the selection gate line SL, −10 V to a word line WL, and 0 V when data "0" is written or 6 V when data "1" is written to the bit line BL and holding the source at a floating state so as to perform parallel write operations on all the bit lines for each word line sector.

Data is read by applying 3 V to 5 V to the selected word line WL and the selection gate line SL, 1 V to 2 V to the selected bit line BL, and 0 V to the source.

In a DINOR type flash memory, there is a particular problem with the data write operation, more specifically the flowing of an interband tunnel current between the drain and base in the "1" data written cells, that is, the cells where the electrons in the floating gate are drawn out by FN tunneling.

FIG. 3 is a view of the results of a write operation calculated by simulation using the device parameters of a DINOR type flash memory prepared as a prototype by the standard 0.6 μm process. In FIG. 3, the horizontal axis (abscissa) shows the time and the vertical axis (ordinate) the threshold voltage.

As will be understood from FIG. 2 and FIG. 3, when data "1" is written, by applying −10 V to the word line WL and 6 V to the bit line BL, the threshold voltage $V_{th}$ changes from approximately 5 V to approximately 1 V and the write operation is completed in a write time of about 1 msec.

Further, FIG. 4 is a view of the results of a calculated simulation of the gate current IG caused by FN tunneling phenomenon in the write operation of FIG. 3 and a drain-base current IDB caused by the interband tunneling phenomenon. In FIG. 4, the horizontal axis (abscissa) indicates time and the vertical axis (ordinate) the tunnel current.

As shown in FIG. 4, the gate current IG and the drain-base current IDB both decline along with the progress in the write operation. The important point here is that the drain-base current IDB is larger by about four orders of magnitude from the gate current IG and is as much as over approximately 300 to 400 nA per cell.

Accordingly, when the write operation is carried out in parallel for all the bit lines as with a general DINOR type flash memory, a large current flows between the drain and substrate and it may be difficult to operate the drain voltage of 6 V by using a power source provided in a chip of the memory. For example, when there are 1024 bit lines, a current of as much as 300 to 400 μA may flow between the drain and the base.

(2) AND Type Flash Memory

FIG. 5 is a view of the configuration of a memory array of an AND type flash memory of the related art comprised of three main bit lines and sub bit lines and 32 memory cells connected in parallel to sub source lines.

In the memory array of FIG. 5, WL1 to WL32 indicate word lines, SL1 and SL2 selection gate lines, M-DBLN−1, and M-DBLN, and M-DBLN+1 main bit lines, S-DBL sub bit lines, SBL a common source line, S-SBL sub source lines, MT1N−1 to MT32N−1, MT1N to MT32N, and MT1N+1 to MT32N+1 memory cell transistors, and ST1N−1, ST1N+1, ST2N−1, ST2N, and ST2N+1 selection transistors.

This AND type flash memory has a so-called contact-less NOR type memory array structure where bit lines and source lines are arranged in a hierarchy of the main lines and the sub line, the selection transistors are arranged between main lines and sub lines, and the memory cell transistors are arranged in parallel between the sub source lines and the sub bit lines.

This AND type flash memory array, compared with the DINOR type flash memory array shown in FIG. 1, is a so-called contact-less memory array structure, and so has the

3 advantage of a smaller cell area if those cells are formed by the same design rule.

FIG. 6 is a view of the bias conditions for erasure, writing, and reading of an AND type flash memory as shown in FIG. 5.

In this AND type flash memory as well, the various operations are controlled under bias conditions similar to those of a DINOR type flash memory. The erasure is performed by injecting electrons into the floating gate by FN tunneling, while data is written by drawing out electrons in the floating gate from the drain by FN tunneling.

Accordingly, the same problem that occurs in the case of a DINOR type flash memory occurs in the case of an AND type flash memory. That is, if the data write operation is carried out in parallel to all bit lines for each word line sector, a large current flows between the drain and base due to the interband tunneling phenomenon and therefore it may be difficult to operate the memory device with a single power source.

(3) ACEE Type Flash Memory

FIG. 7 is a view of the configuration of a memory cell of an ACEE type flash memory. FIG. 8 is a view of the bias conditions for erasure, writing, and reading of an ACEE type flash memory as shown in FIG. 7.

In FIG. 7, WL1 and WL2 indicate word lines, D1 and D2 drain side bit lines, S1 and S2 source side bit lines, and MT11, MT12, MT21, and MT22 memory cell transistors.

In an ACEE cell, the source and drain are formed by buried diffusion layers. The memory is of a so-called contact-less array structure which is basically the same as the AND type flash memory array structure.

An ACEE type flash memory, however, operates as follows: Erasure is performed by drawing out the electrons in the floating gate from the source side by FN tunneling while data is written by injecting electrons into the floating gate from the source side by FN tunneling. These operations are reverse to those of the above-mentioned DINOR type flash memory and AND type flash memory.

Accordingly, in the case of an ACEE type flash memory, the problem of the interband tunnel current which occurs in the case of the DINOR type flash memory and the AND type flash memory does not arise at all. That is, in the case of an ACEE type flash memory, an interband tunnel current flows between the source and base at the time of erasure, but there is no need to control the "1" and "0" states of the data at the time of an erasure operation unlike the case of a write operation, so the source voltage applied at the time of erasure may be the power source voltage $V_{cc}$ with no need to use a booster voltage.

However, an ACEE cell is not formed based on the concept of a complete single-transistor memory with respect to the injection and withdrawal of the electrons, which are performed through a tunnel window provided in a partial area of the source diffusion layer and over-erased cells are saved by providing a selection transistor portion operating by control gates at a channel portion of the drain side, as in a FLOTOX cell. According, an ACEE cell becomes large in cell area and is not suited for a large capacity flash memory.

As explained above, in the DINOR type, AND type, and ACEE type flash memories, the writing and erasing of data are both performed by FN tunneling, but suffer from the following disadvantages. In the case of a DINOR type flash memory and AND type flash memory, it is difficult to operate with a single power source due to the large interband

4 tunnel current flowing between the drain and base at the time of writing data. Further, an ACEE type flash memory is not formed based on the concept of a complete single-transistor memory, so the cell area becomes large and therefore it is not suited for a high-integrated large capacity flash memory.

SUMMARY OF THE INVENTION

A first object of the present invention is to provide a flash EEPROM which can be operated by a single power source.

A second object of the present invention is to provide a flash EEPROM which is reduced in area by forming a complete single-transistor memory cell.

To achieve the above objects, the present invention provides a semiconductor nonvolatile memory device comprised of bit lines and source lines arranged in a hierarchy of main lines and sub-lines, the main lines and the sub-lines being selectively connected in accordance with the operation and memory cells being connected in parallel between the sub-source lines and the sub-bit lines, wherein data is written by injecting electrons from the full channel surface to the charge-storage layer by FN tunneling and is erased by drawing out the electrons in the charge-storing layer from the drain side by FN tunneling.

In the semiconductor nonvolatile memory device of the present invention, preferably, at the time of writing, the selected word line is set to a first positive voltage and the non-selected word lines are set to a second positive voltage lower than said first positive voltage and, at the time of erasing, the selected word line is set to a negative voltage and all the bit lines are set to a positive voltage.

In the semiconductor nonvolatile memory device of the present invention, further, preferably, at the time of writing, the selected word line is set to a first positive voltage and the non-selected word lines are set to a second positive voltage lower than said first positive voltage and, at the time of erasing, word lines are set to a negative voltage in units of word line sectors, all of the bit lines are set to a positive voltage, the erasure pulse is divided into a plurality of erasure pulses, and bit line pulses of the cells finished being erased are switched from a plus voltage to a reference potential to perform an individual bit verify erasure operation.

Alternatively, in the semiconductor nonvolatile memory device, data is written by introducing electrons from the full channel surface to the charge-storage layer by FN tunneling and is erased by drawing out the electrons in the charge-storing layer from the full channel surface by FN tunneling.

In this case, at the time of writing, the selected word line is set to a first positive voltage and the non-selected word lines are set to a second positive voltage lower than said first positive voltage and, at the time of erasing, all the word lines are set to a negative voltage and all the bit lines are set to a reference voltage.

The present invention also provides a semiconductor nonvolatile memory device having a plurality of memory cells provided with charge-storing layers, wherein the memory cells are divided into units of erasure blocks and there are a plurality of column decoders provided corresponding to the divided blocks and at least the erasure and write operations are performed in units of column decoders.

According to the semiconductor nonvolatile memory device of the present invention, there is provided a configuration comprised of bit lines and source lines arranged in a hierarchy of main lines and sub-lines, the main lines and the sub-lines being selectively connected in accordance with the operation and memory cells being connected in parallel between the sub-source lines and the sub-bit lines, wherein data is written by introducing electrons by FN tunneling and is erased by drawing out the electrons by FN tunneling. As a result, no interband tunnel current flows at the time of writing data, so a semiconductor nonvolatile memory device which can operate with a single power source can be realized.

Further, the semiconductor nonvolatile memory device is a flash memory of the complete single-transistor memory type which has a so-called contact-less NOR type memory array structure and is suited for large capacity flash memories.

In addition, since the semiconductor nonvolatile memory device of the present invention performs the individual bit verify erasure operation at the time of an erasure operation, there is little variation in the distribution of threshold values at the time of erasure. As a result, not only is it possible to realize a semiconductor nonvolatile memory device of the complete single-transistor memory type where there is no need to provide a selection gate at the drain side, but also a sufficient margin for reading can be secured even with future reductions in voltage of power sources.

Still further, according to the semiconductor nonvolatile memory device of the present invention, the erasure and write operations are performed in units of column decoders. As a result, it is possible to realize a memory cell improved in the drain disturbance resistance without adding any new interconnection layers.

BRIEF DESCRIPTION OF THE DRAWINGS

These and other features and effects of the present invention will become more apparent from the following description of preferred embodiments made with reference to the following drawings, in which

FIG. 2 is a view of the bias conditions for erasure, writing, and reading of a DINOR type flash memory as shown in FIG. 1;

FIG. 6 is a view of the bias conditions for erasure, writing, and reading of an AND type flash memory as shown in FIG. 5;

FIG. 10 is a view of the bias conditions for the first erasure, writing, and reading operations of a flash memory according to the present invention;

FIG. 11 is a view of the bias conditions for the second erasure, writing, and reading operations of a flash memory according to the present invention;

DESCRIPTION OF THE PREFERRED EMBODIMENTS

Figure 9:
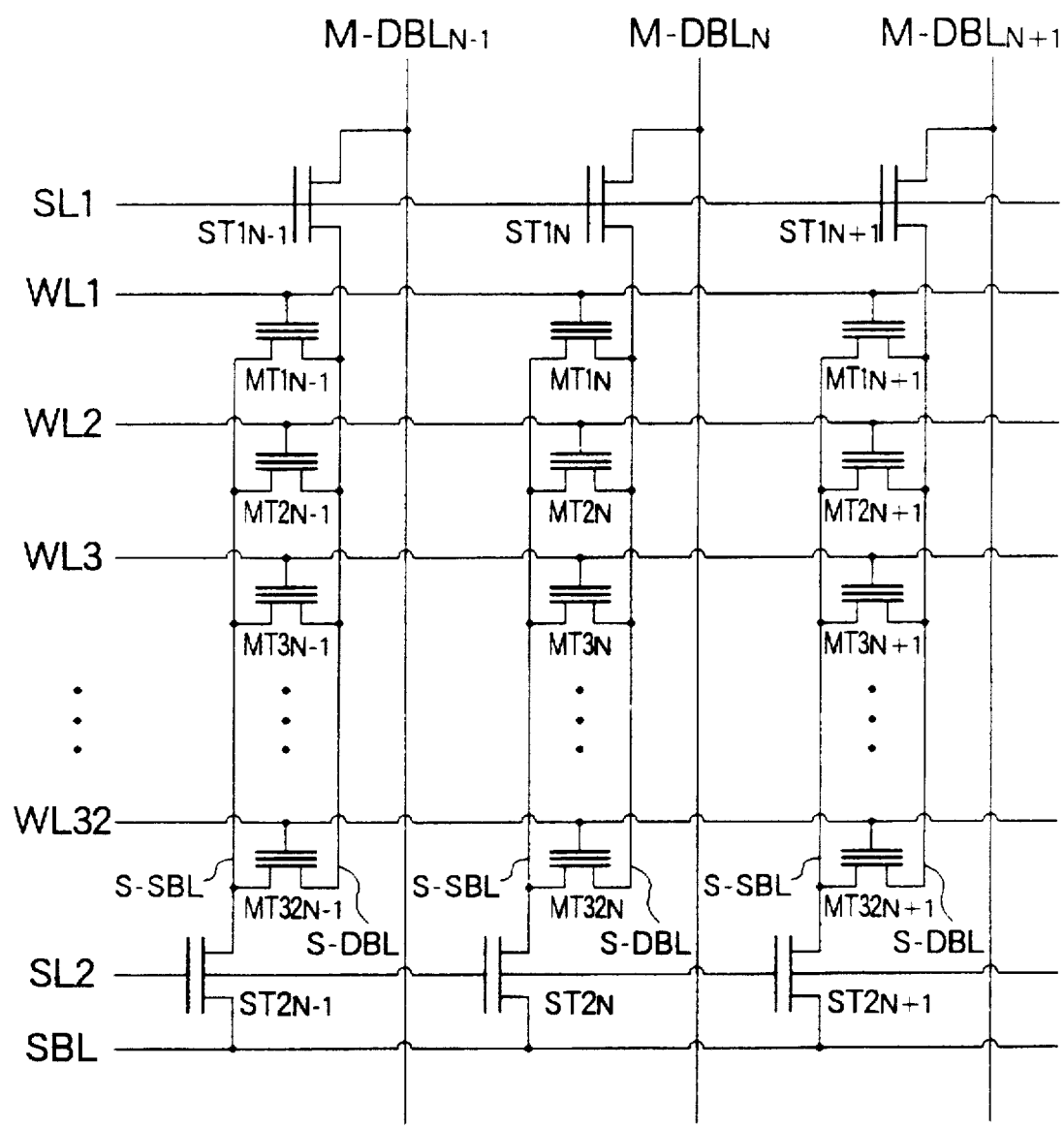
FIG. 9 is a view of the configuration of a memory array of a flash memory according to the present invention.

FIG. 9 is a view of the configuration of a memory array of a flash memory according to the present invention.

In the memory array of FIG. 9, WL1 to WL32 indicate word lines, SL1 to SL2 selection gate lines, M-DBLN−1, M-DBLN, and M-DBLN+1 main bit lines, S-DBL sub-bit lines, SBL a common source line, S-SBL sub-source lines, MT1N−1 to MT32N−1, MT1N to MT32N, and MT1N+1 to MT32N+1 memory cell transistors, and ST1N−1, ST1N, ST1N+1, ST2N−1, ST2N, and ST2N+1 selection transistors.

Figure 1:
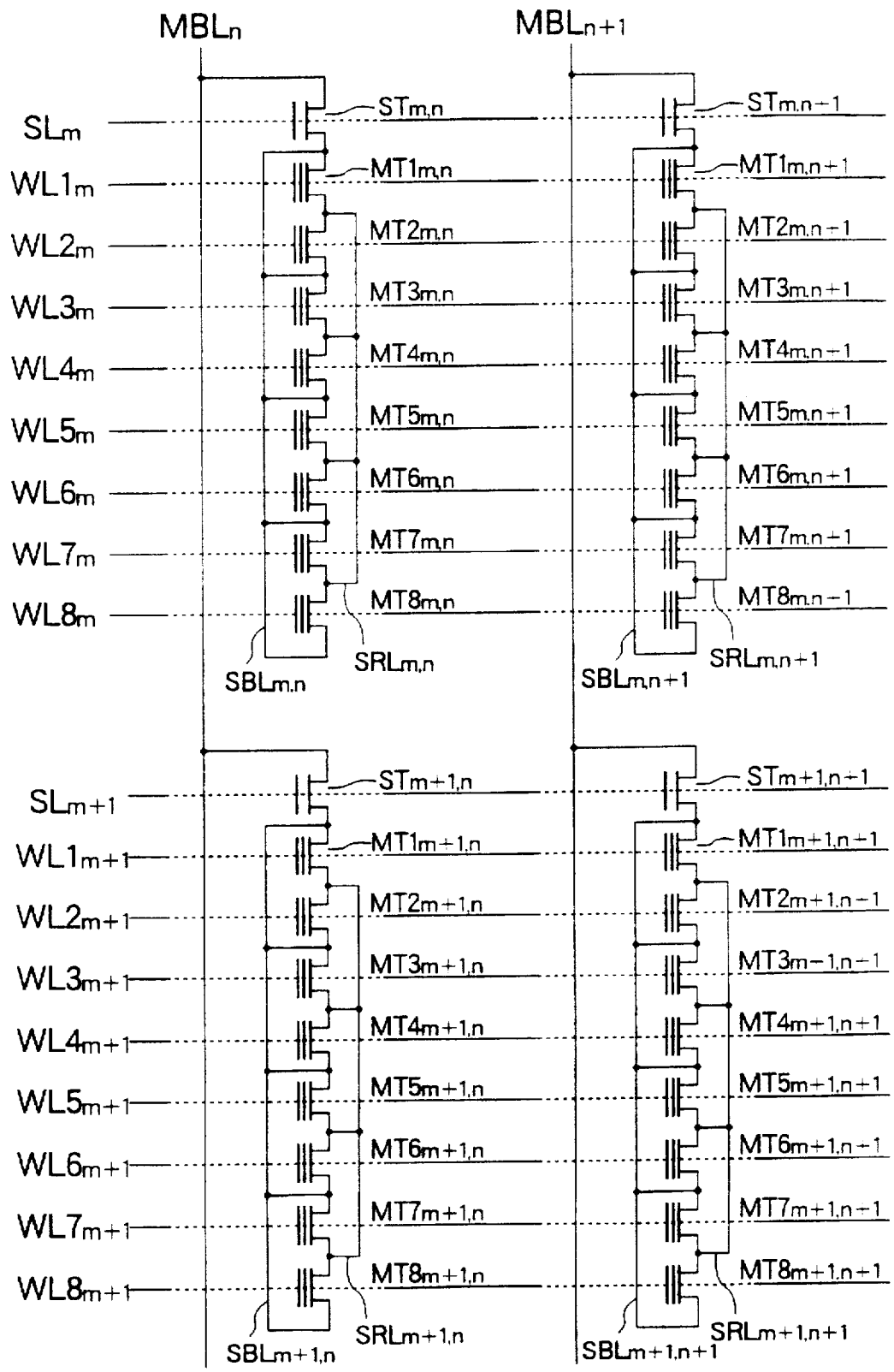
FIG. 1 is a view of the configuration of a memory array of a DINOR type flash memory of the related art comprised of two groups of eight word lines connected to two main bit lines and sub-bit lines.
Figure 3:
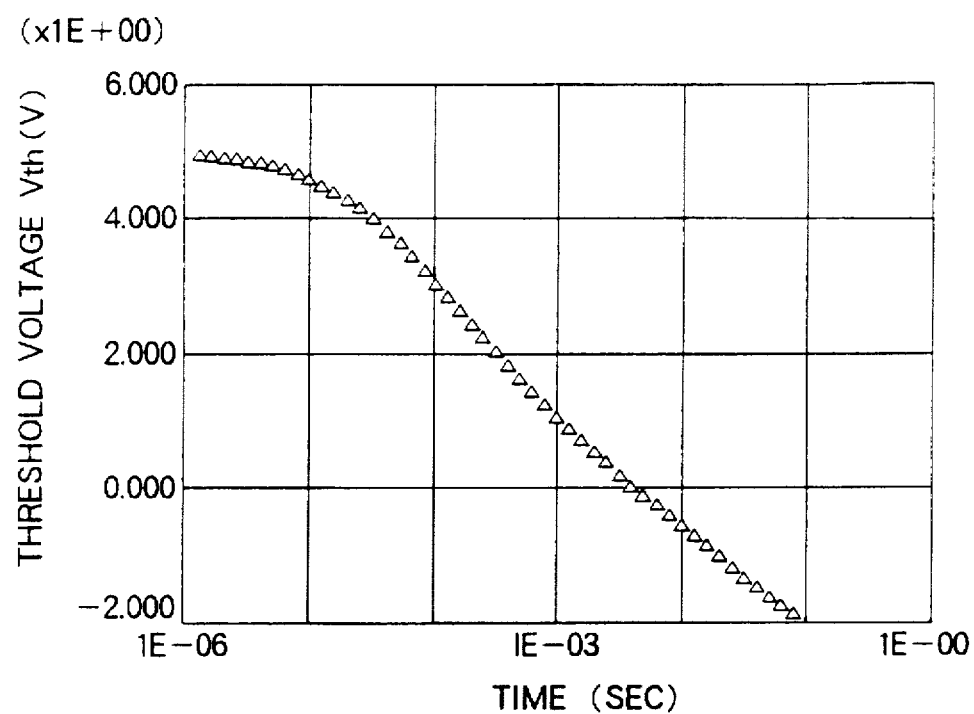
FIG. 3 is a view of the results of a write operation calculated by simulation using the device parameters of a DINOR type flash memory prepared as a prototype by the standard 0.6 μm process.
Figure 4:
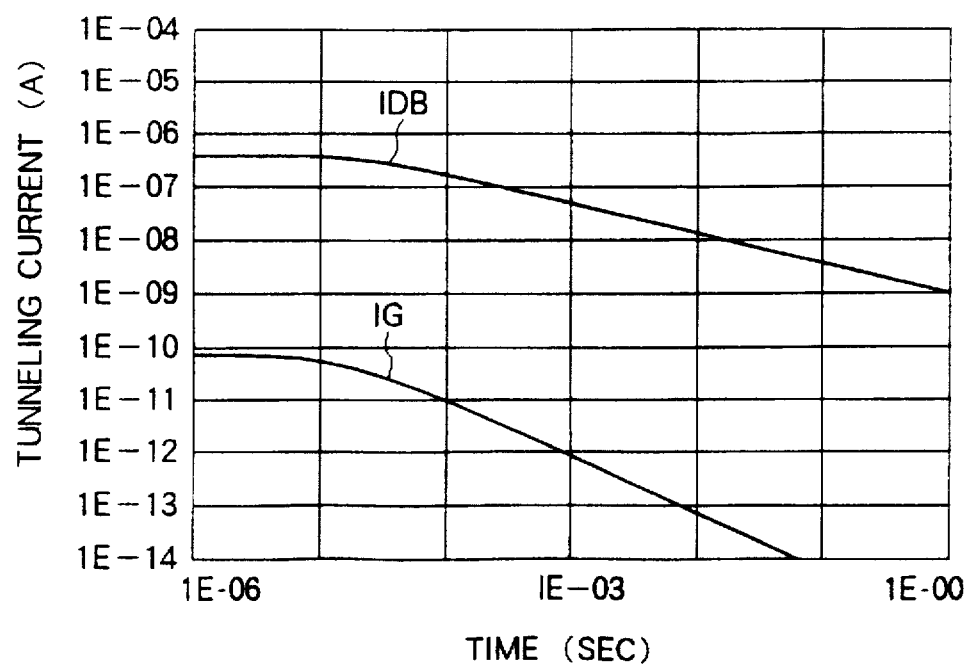
FIG. 4 is a view of the results of calculation by simulation of gate current caused by FN tunneling in the write operation of FIG. 3 and a drain-base current caused by interband tunneling.
Figure 5:
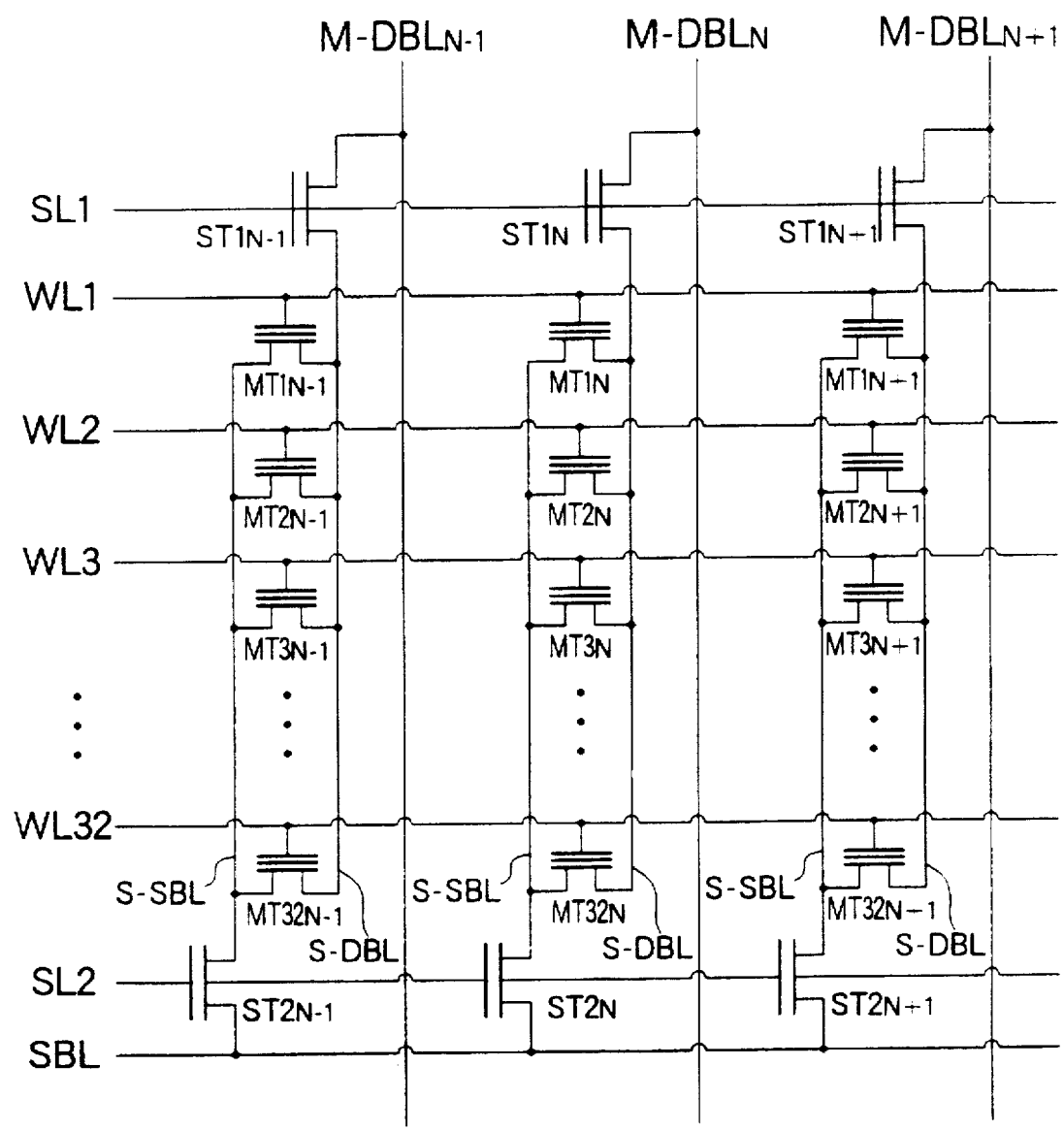
FIG. 5 is a view of the configuration of a memory array of an AND type flash memory of the related art comprised of three main bit lines and sub-bit lines and 32 memory cells connected in parallel to sub-source lines.
Figures 7, 8:
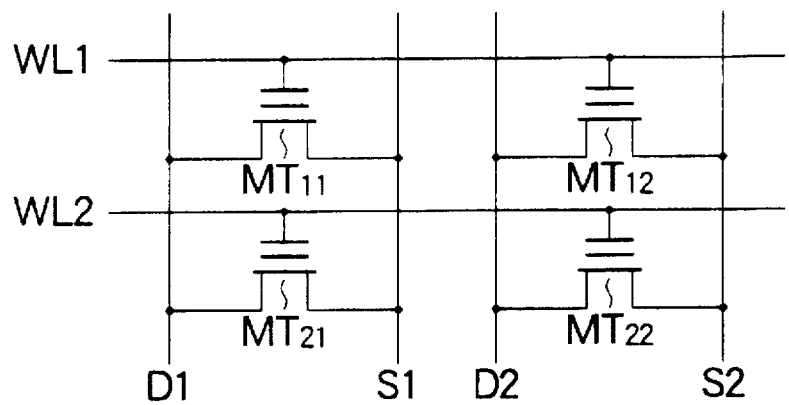
FIG. 7 is a view of the configuration of a memory cell of an ACEE type flash memory.
FIG. 8 is a view of the bias conditions for erasure, writing, and reading of an ACEE type flash memory as shown in FIG. 7.

The configuration of the memory array itself is the same as the configuration of the AND type memory array of FIG. 5. That is, it is a so-called contact-less NOR type memory cell structure wherein the bit lines and the source lines are arranged hierarchically as main lines and sub-lines, selection transistors are arranged between the main lines and sub-lines, and memory cell transistors are arranged in parallel between the sub-source lines and the sub-bit lines.

As shown in FIG. 10 and FIG. 11, however, the bias conditions for the lines at the time of erasure, writing, and reading differ from the bias conditions for the AND type memory array of the related art shown in FIG. 6.

Below, the structure of the flash memory according to the present invention, the bias conditions for the lines at the time of erasure, writing, and reading, and those operations will be explained with reference the drawings.

Figure 12:
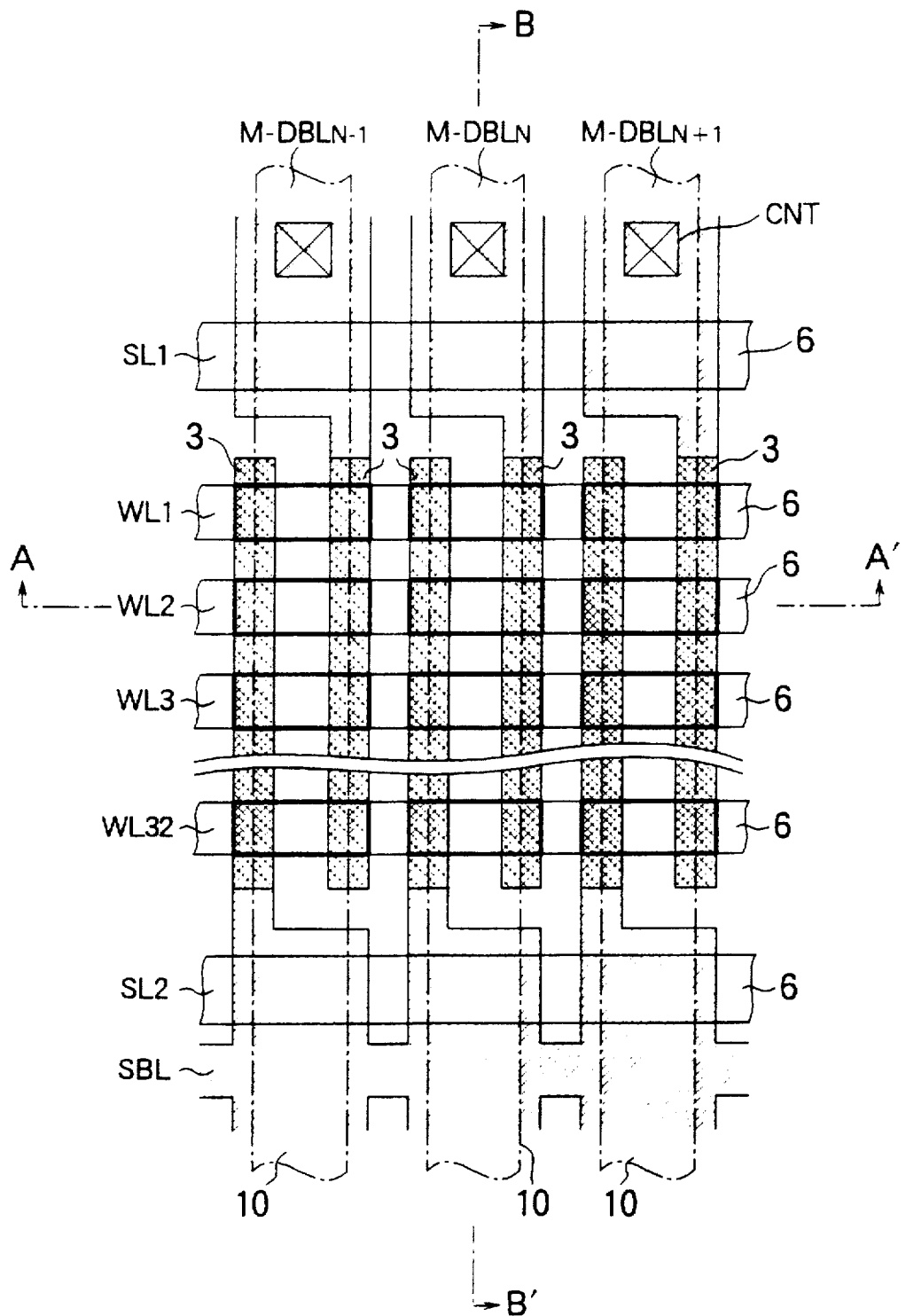
FIG. 12 is a view of the plane pattern layout of the memory array of FIG. 9.
Figure 13:
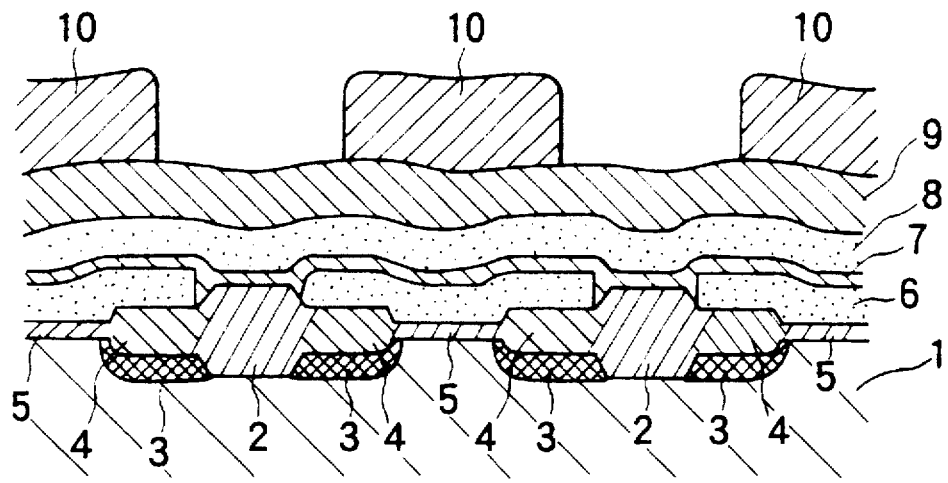
FIG. 13 is a cross-sectional view in the A—A line arrow direction of FIG. 12.

FIG. 12 is a view of the plane pattern layout of the memory array of FIG. 9; FIG. 13 is a cross-sectional view in the A—A line arrow direction of FIG. 12; and FIG. 14 is a cross-sectional view in the B—B line arrow direction of FIG. 12.

In the figures, 1 is a semiconductor substrate, 2 a first LOCOS, 3 an N$^+$ buried diffusion layer, 4 a second LOCOS, 5 a tunnel oxide layer, 6 a floating gate polycrystalline silicon layer, 7 an ONO multi-layer insulating film, 8 a control gate polycrystalline silicon layer, 9 an insulating film, 10 an aluminum (AL) interconnection, and CNT a contact hole.

Figure 14:
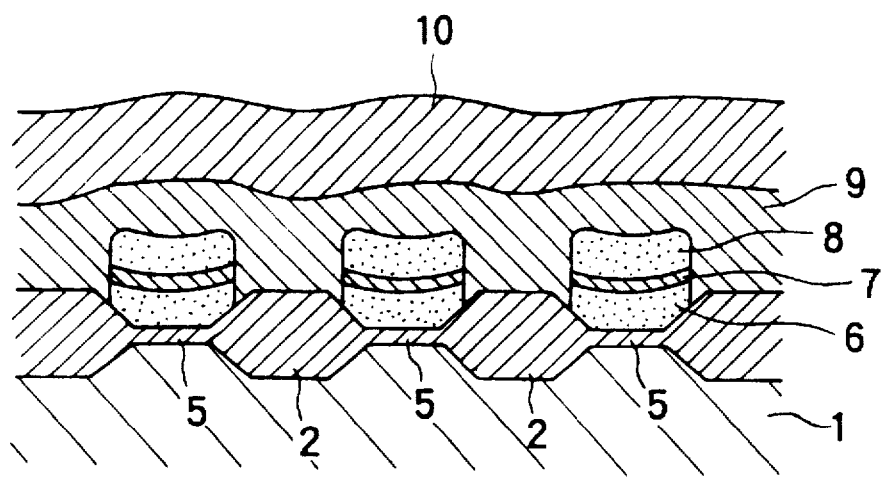
FIG. 14 is a cross-sectional view in the B—B line arrow direction of FIG. 12.

As shown in FIG. 12 to FIG. 14, a so-called contact-less NOR type memory array structure is formed where the sub-bit line S-DBL and the sub-source line S-SBL are comprised from a buried diffusion layer 3 formed under the second LOCOS oxide film 4.

Next, an explanation of the process of production as seen from the cross-section along line A—A will be explained with reference to FIGS. 15A to 15I.

Figure 15A:
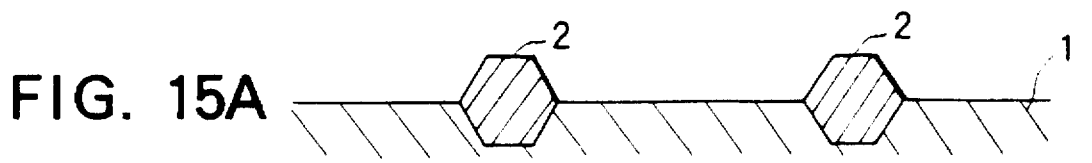
FIGS. 15A to 15I are process charts for explaining the process for production of the flash memory of FIG. 12.

First, as shown in FIG. 15A, a semiconductor substrate 1 is subjected to LOCOS oxidation for isolation of elements to form a first LOCOS 2.

Figure 15B:
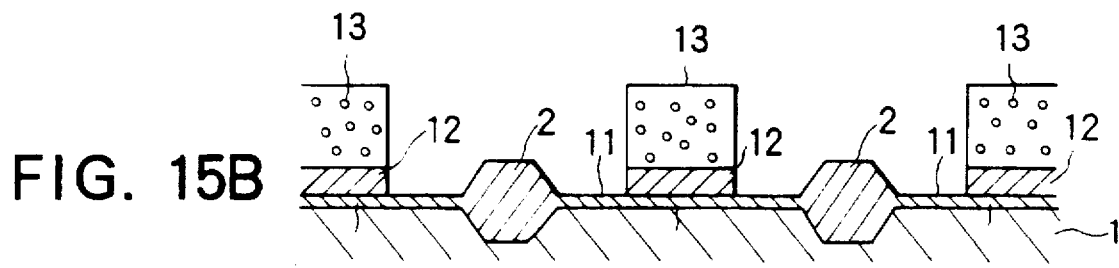

Next, as shown in FIG. 15B, a pad oxide film 11 of a thickness of about 10 nm is formed, then an $Si_3N_4$ film 12 of about 30 nm is deposited, and a resist film 13 is formed, then etching is performed for forming a buried diffusion layer.

Figure 15C:
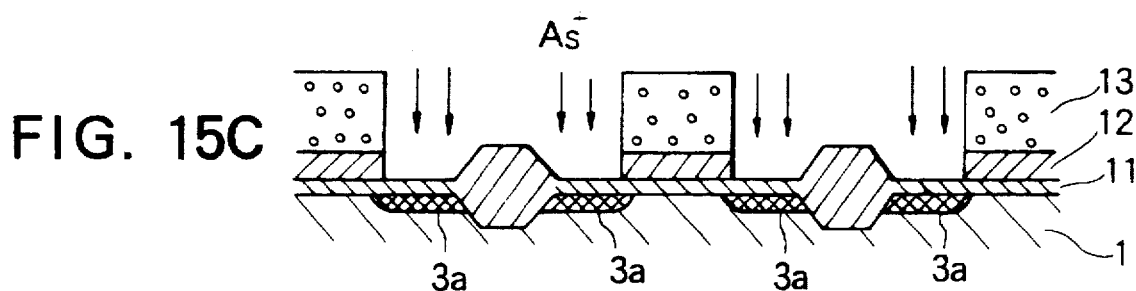

As shown in FIG. 15C, in the state with the resist film 13 formed at a desired area, $As^+$ ions are injected to an extent of 1E14 to 1E16 ($10^{14}$ to $10^{16}$) to form a source-drain diffusion layer 3a.

Figure 15D:
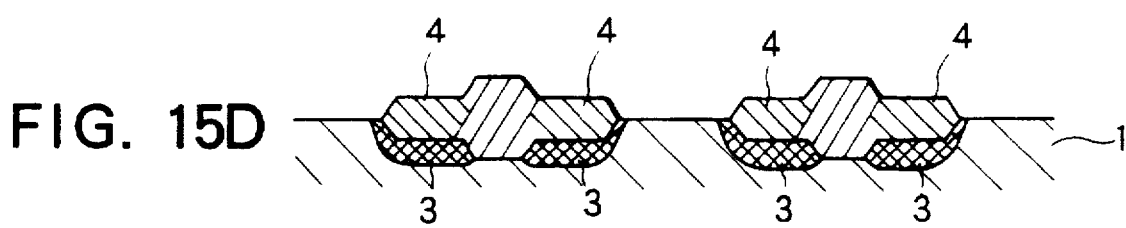

Next, as shown in FIG. 15D, the resist film 13 is removed, then second LOCOS oxidation is performed to form a second LOCOS 4 of a thickness of about 100 nm on the source-drain diffusion layer 3a and to form a buried source-drain diffusion layer 3. After the second LOCOS oxidation, the $Si_3N_4$ film 12 and the pad oxide film 11 are removed.

Figure 15E:
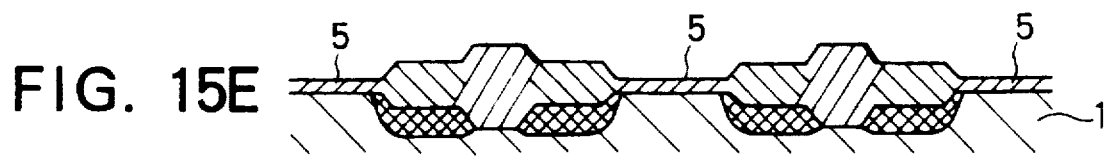

Next as shown in FIG. 15E, a tunnel oxide film 5 is formed to a thickness of about 10 nm.

Figure 15F:
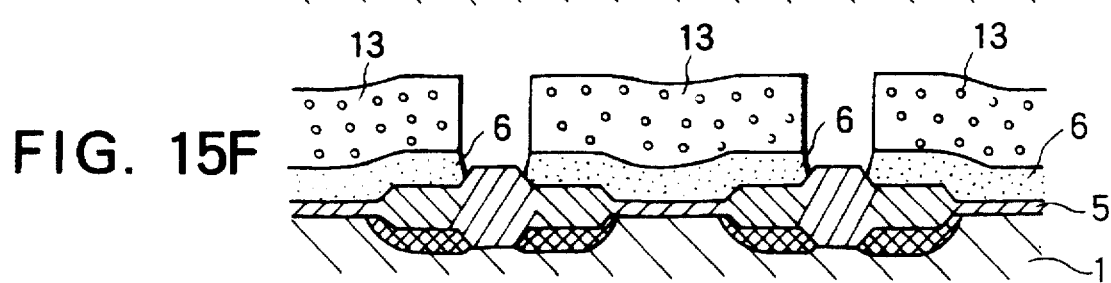

Next, as shown in FIG. 15F, a floating gate use polycrystalline silicon layer 6 comprised of $N^+$ doped polycrystalline silicon is deposited to a thickness of about 100 nm, then etching is performed.

Figure 15G:
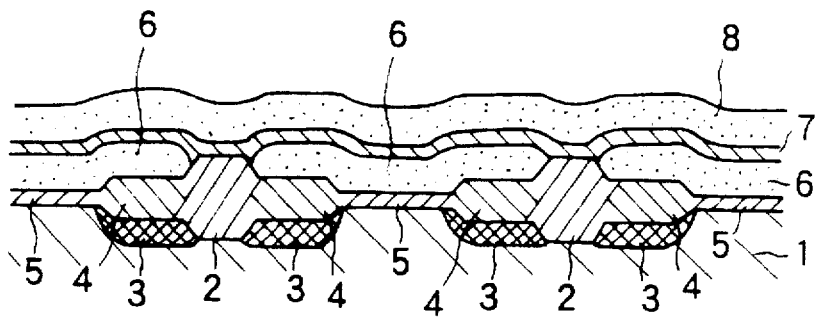

Next, as shown in FIG. 15G, the interlayer ONO multi-layer insulating film 7 is formed, then the control gate polycrystalline silicon layer 8 is deposited.

This ONO laminated insulating film 7 is for example formed as follows: First, a thermal oxide film of the floating gate polycrystalline silicon layer 6 is formed to a thickness of 14 nm, then an $Si_3N_4$ film of a thickness of about 11 nm is formed by the CVD method, and finally a thermal oxide film of a thickness of 2 nm or so is formed on the $Si_3N_4$ film by thermal oxidation. The thickness of the thus formed ONO multi-layer insulating film 7 is about 22 nm converted to $SiO_2$.

Further, the control gate use polycrystalline silicon layer 8 is of a "polysilicide" structure comprised of 100 nm or so of $N^+$ doped polycrystalline silicon and 100 nm or so of tungsten silicide.

Figure 15H:
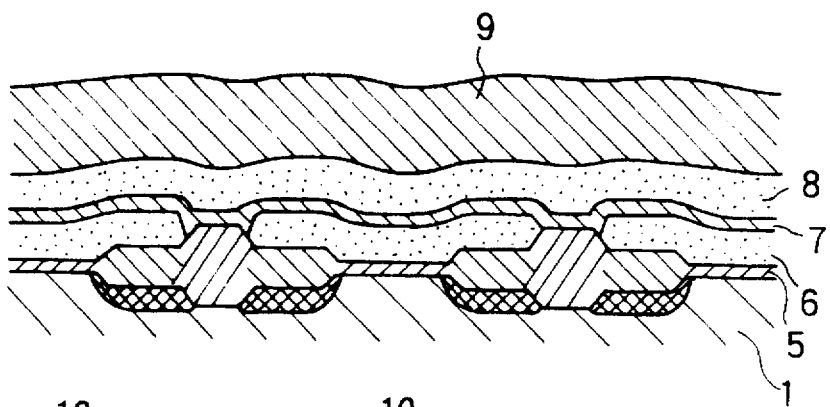

Next, as shown in FIG. 15H, the control gate polycrystalline silicon layer 8, the ONO multi-layer insulating film 7, and the floating gate polycrystalline silicon layer 6 are etched by self-alignment.

Figure 15I:
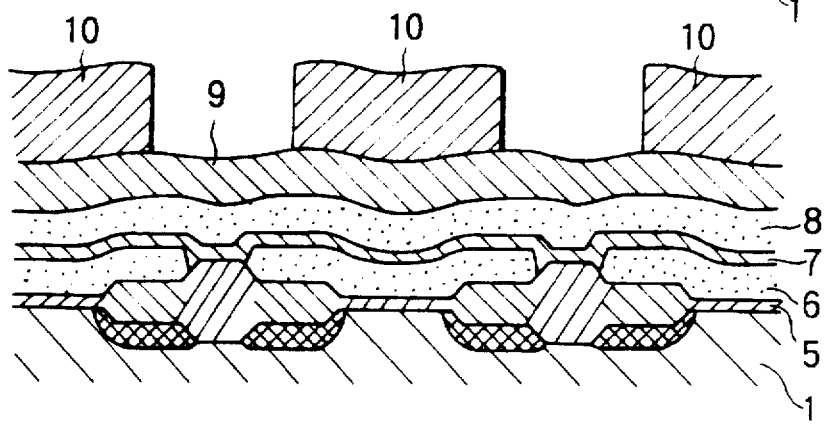

The insulating film 9 is formed on the control gate polycrystalline silicon layer 8, then in the same way as the normal CMOS process, as shown in FIG. 15I, the AL lines 10 are formed as the main bit lines M-DBLN−1, M-DBLN, and M-DBLN+1.

Next, an explanation will be made of the erasure, write, and read operations of the flash memory according to the present invention with reference to FIG. 16 to FIG. 20.

Figure 16:
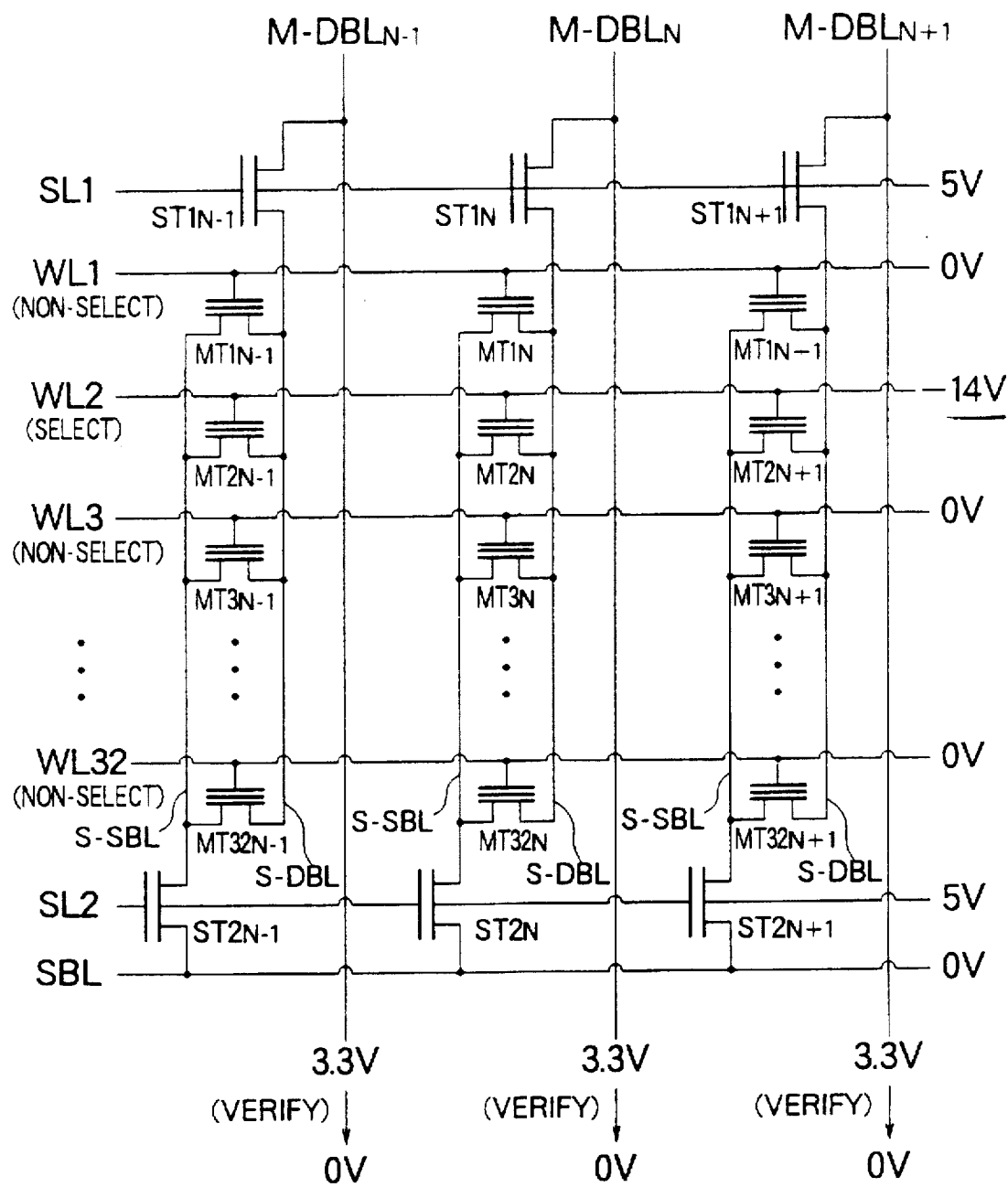
FIG. 16 is a view of the bias conditions according to a first example of the erasure operation in the flash memory according to the present invention.

FIG. 16 is a view of the bias conditions according to a first example of the erasure operation in the flash memory according to the present invention.

The erasure operation according to the first example is performed by drawing out the electrons in the floating gate from the drain side by FN tunneling phenomenon.

That is, as shown in FIG. 10, this is done by applying −14 V to the selected word line, for example, as shown in FIG. 16, the word line WL2, 3.3 V (power source voltage $V_{cc}$) to all the main bit lines M-DBLN−1, M-DBLN, and M-DBLN+1, and 5 V to the selection gate lines SL1 and SL2. At this time, 0 V is applied to the other word lines WL1 and WL3 to WL32 and the common source line SBL.

At the time of erasure shown in FIG. 16 as well, an interband tunnel current flows between the drain and the base.

However, unlike the data write operation of the DINOR type and AND type flash memories, there is no need to control the "1" and "0" states of the data by the bit line voltage, so the bit line voltage applied may be the power source voltage $V_{cc}$ and therefore the interband tunnel current does not pose a problem.

Further, as the units of the erasure blocks, consideration may be given to the case of using units of word line sectors and the case of using units of 32 word lines connected to the same bit line. In the former case, however, the disturbance at the time of writing data becomes severe, so the latter is appropriate. In this case, the erasure operation may be performed by successively erasing WL1 to WL32 using units of word line sectors.

Further, in the erasure operation of FIG. 16, by controlling the bit line voltages from 3.3 V to 0 V, an individual bit verify erasure operation becomes possible and keeping the narrow distribution of the threshold voltage $V_{th}$ at the time of erasure becomes possible.

The individual bit verify erasure operation is performed as follows after dividing the erasure pulse into a plurality of erasure pulses. First, the read/write latches, not shown, of all of the bit lines are set so that the power source voltage $V_{cc}$ (3.3 V) is applied to all the bit lines at the time of erasure. Next, the erasure pulses are applied, then a verify read operation for applying a verify voltage to the word lines is performed so as to reset the read/write latches of the bit line memory cells finished being erased and thereby make the bit line voltage become 0 V at the time of erasure. The erasure operation is ended by the resetting of the read/write latches of all of the bit lines.

Figure 17:
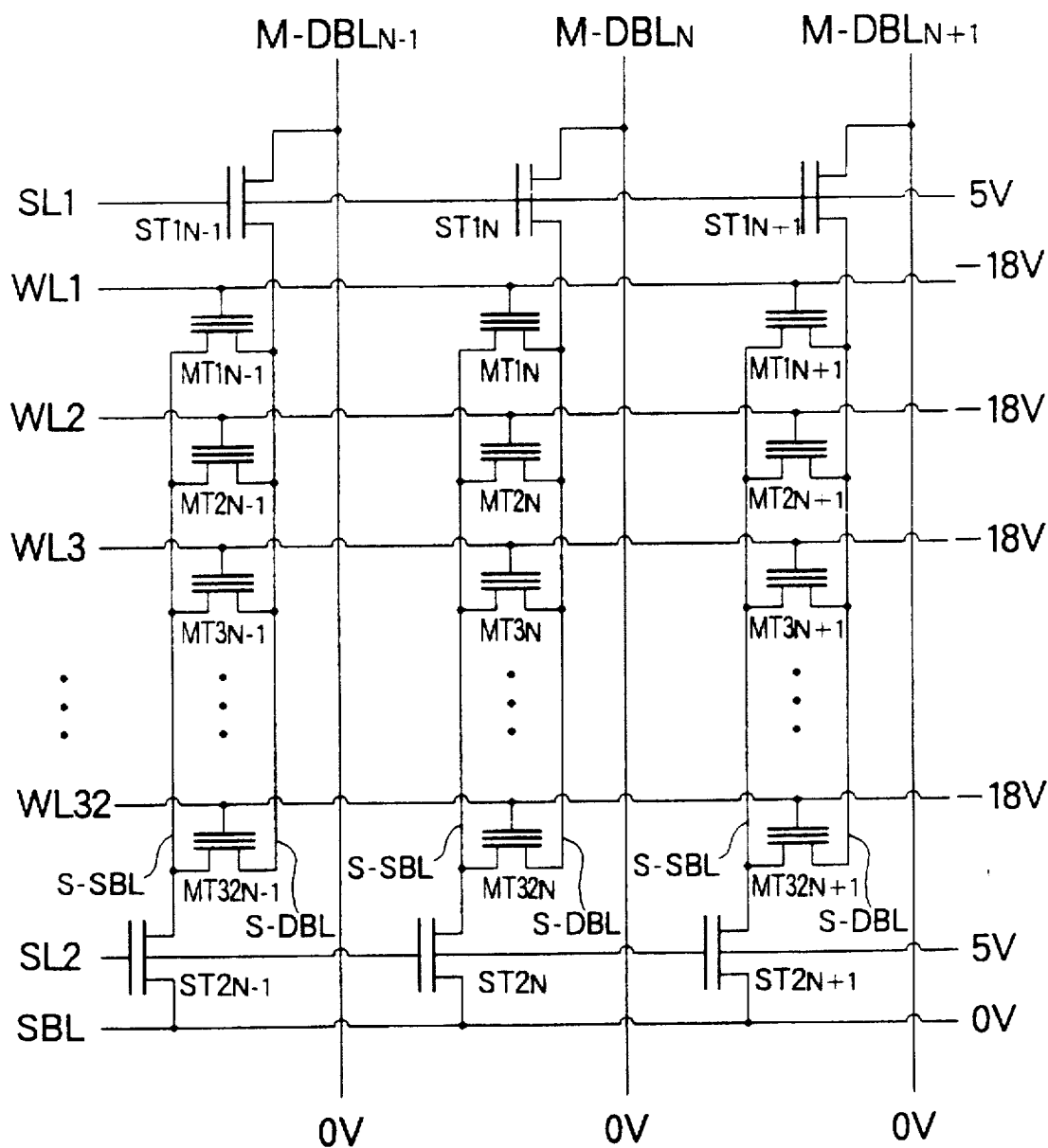
FIG. 17 is a view of the bias conditions according to a second example of the erasure operation in the flash memory according to the present invention.

FIG. 17 is a view of the bias conditions according to a second example of the erasure operation in the flash memory according to the present invention.

In the second example, the erasure operation is performed by drawing out the electrons in the floating gate from the full surface of the channel by FN tunneling phenomenon.

In the example of FIG. 17, as shown in FIG. 11, the erasure operation is performed by applying 18 V to the word lines WL1 to WL32.

In the case of the second example of FIG. 17, however, unlike the first example of FIG. 16, it becomes impossible to perform an individual bit verify erasure operation. This is disadvantageous compared with the first example from the viewpoint of the suppression of a spread in the distribution of the threshold voltage $V_{th}$ after erasure.

Next, an explanation will be made of the write operation.

Figure 18:
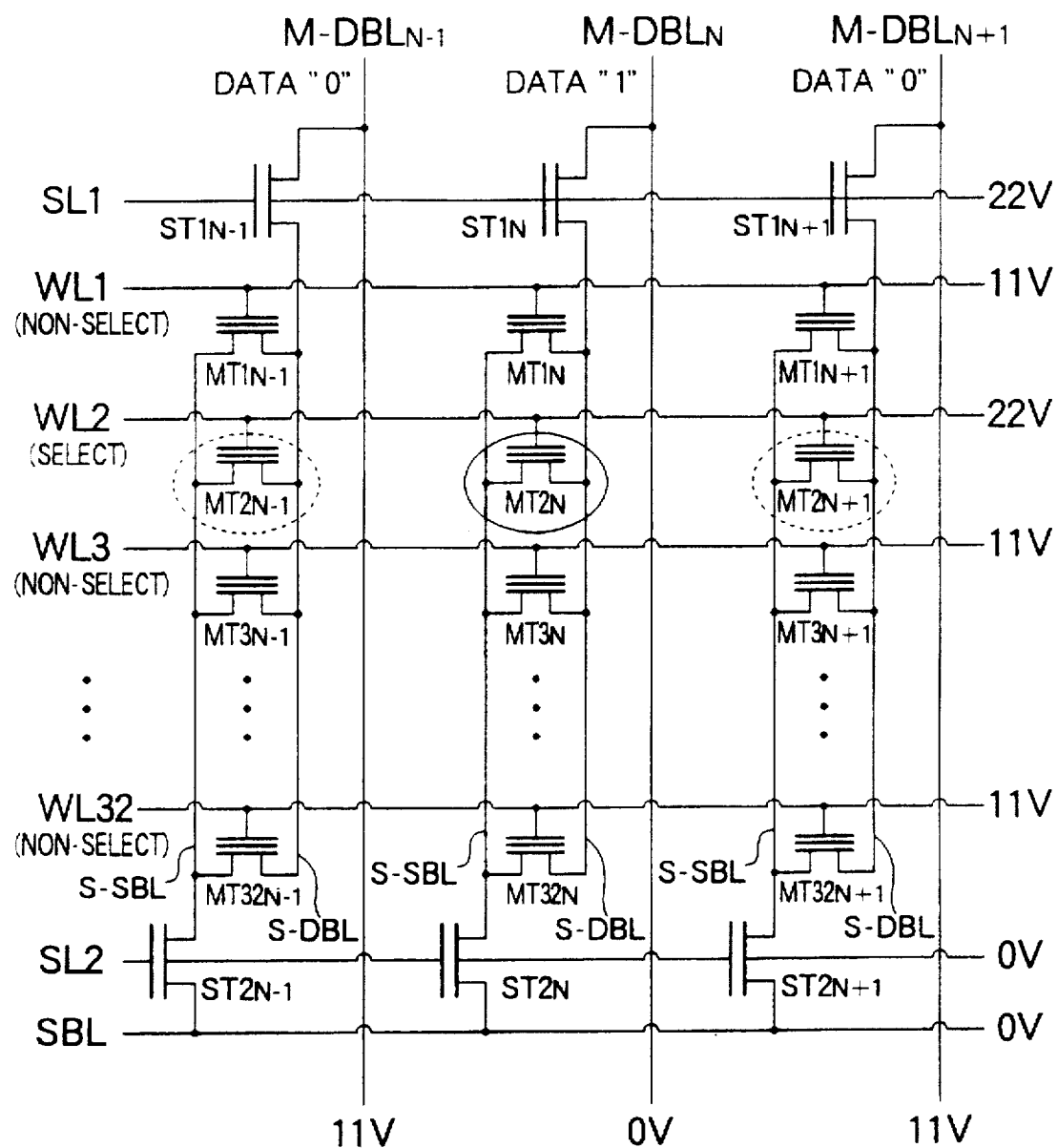
FIG. 18 is a view of the bias conditions of a write operation in a flash memory according to the present invention.

FIG. 18 is a view of the bias conditions of an example of a data write operation in a flash memory according to the present invention.

In this example, the write operation of data is performed by injecting electrons from the full surface of the channel to the floating gate by FN tunneling.

In the example of FIG. 18, 22 V is applied to the selected word line WL2 and the selection gate line SL1, 0 V is applied to the main bit line M-DBLN to which the "1" data written cell MT2N is connected, and the intermediate potential 11 V is applied to the main bit lines M-DBLN−1 and M-DBLN+1 to which the "0" data written cells MT2N−1 and MT2N+1 are connected, so that data are written in parallel for all bit lines in units of word line sectors. At this time, the selection gate line SL2 and the common source line SBL are held at 0 V.

As a result, electrons are injected into the floating gates of only the "1" data written cells and the threshold voltage $V_{th}$ of the memory cells becomes more than 5 V.

Further, in the write operation of FIG. 18, the source lines S-SBL become the same potential as the sub-bit lines S-DBL, but the selection gate line SL2 of the source side becomes 0 V and is isolated from the common source line SBL, so short-circuiting between adjoining sub-source lines is prevented.

Next, an explanation will be made of the read operation.

Figure 19:
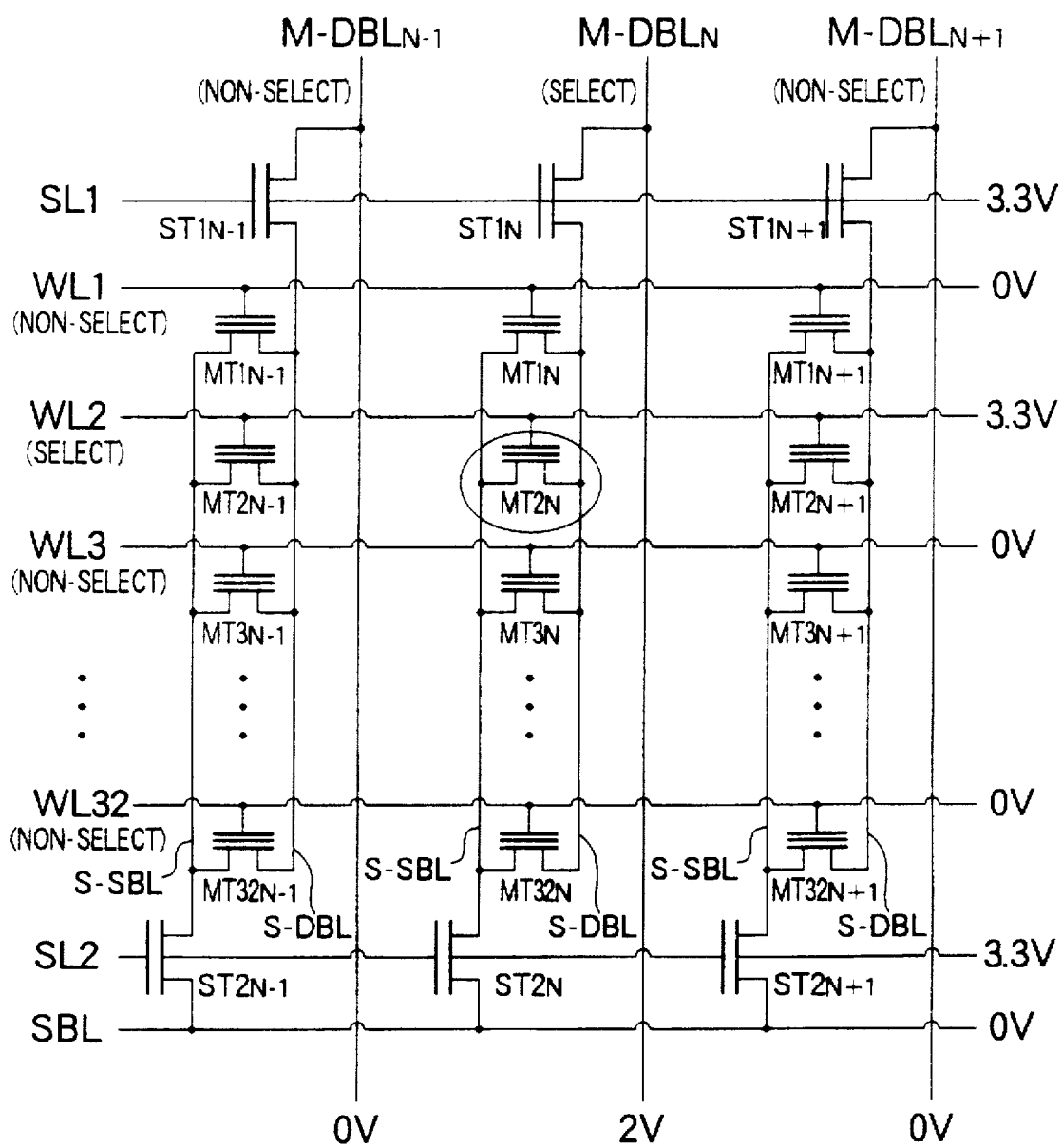
FIG. 19 is a view of the bias conditions of a read operation in a random mode of the flash memory according to the present invention.
Figure 20:
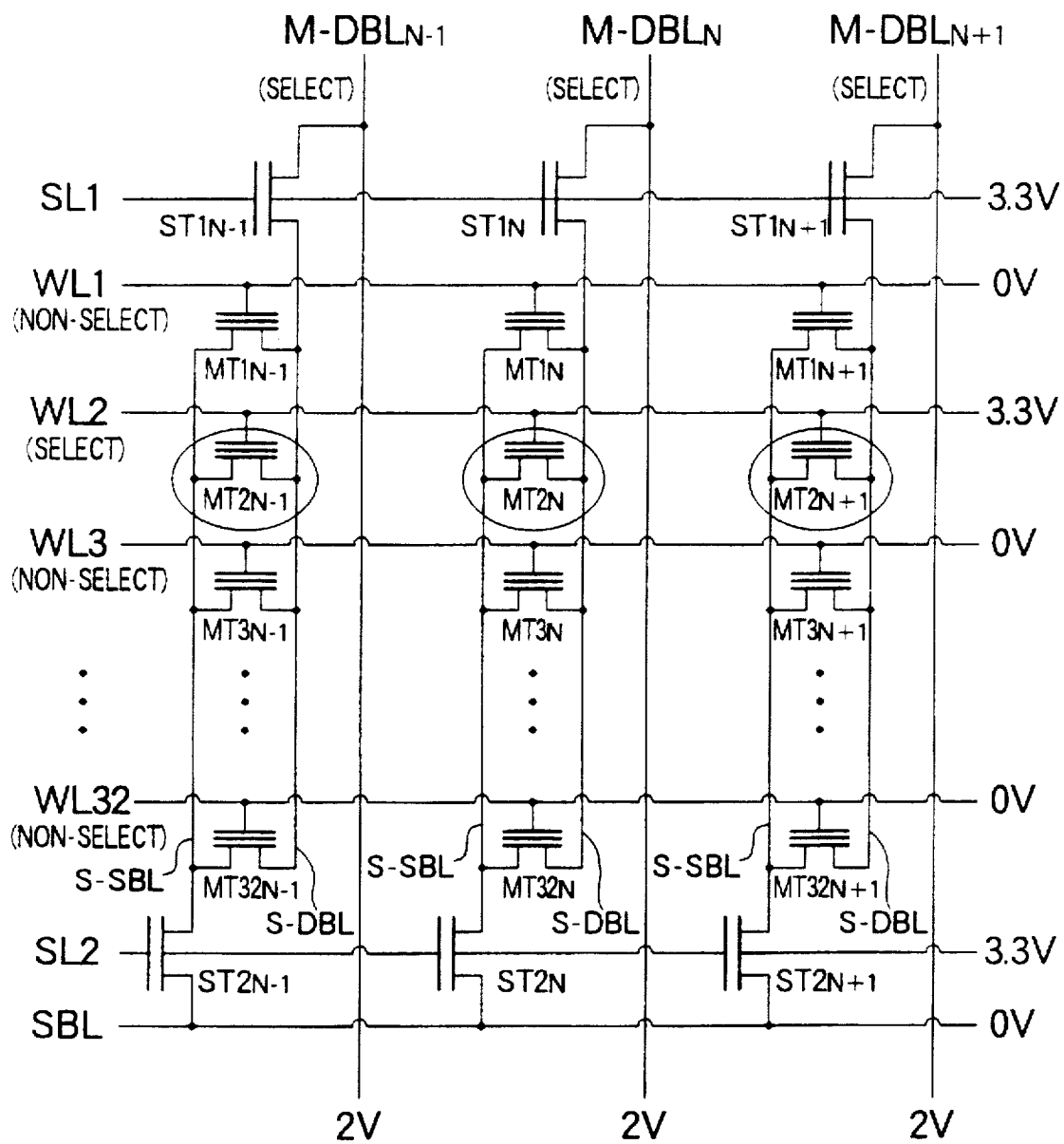
FIG. 20 is a view of the bias conditions of a read operation in a page mode of the flash memory according to the present invention.

FIG. 19 and FIG. 20 are views of the bias conditions of read operations of the flash memory according to the present invention. More specifically, FIG. 19 shows the bias conditions of a read operation in a random access mode, while FIG. 20 shows the bias conditions of a read operation in a page mode using units of word lines.

In the random mode of FIG. 19, 3.3 V is applied to the word line WL2 to which the selected memory cell, for example, the memory cell MT2N, is connected, 2 V to the main bit line M-DBLN, and 3.3 V to the selection gate line SL1 and SL2. At this time, the non-selected word lines WL1 and WL3 to WL32 and the main bit lines M-DBLN−1 and MDBLN+1 and the common source line SBL are held at 0 V. As a result, it is judged by a not shown control system that the data is "0" when a read cell is on and "1" when it is off.

Further, in the page mode of FIG. 20, 3.3 V is applied to the selected word line WL2 and 2 V is applied to all the main bit lines M-DBLN−1, M-DBLN, and M-DBLN+1. As a result, the content of the data of the memory cells MT2N−1, MT2N, and MT2N+1 on the selected word line WL2 are read into the read/write latches, not shown, for each bit line.

The bias conditions of the above erasure, write, and read operations are summarized in tables in FIG. 10 and FIG. 11. FIG. 10 shows the case of the erasure operation of the first example of FIG. 9 and FIG. 11 shows the case of the erasure operation of the second example of FIG. 17.

As explained above, according to this embodiment, it is possible to avoid the disadvantage of interband tunnel current which occurred in DINOR type semiconductor nonvolatile memory devices and AND type semiconductor nonvolatile memory devices, not increase the cell area as with a FLOTOX type EEPROM and ACEE type semiconductor nonvolatile memory device, and realize an NOR type semiconductor nonvolatile memory device of the FN/FN tunneling type of the complete single-transistor memory type.

Accordingly, it is possible to realize a large capacity NOR type flash memory able to operate with a single power source.

Figure 21:
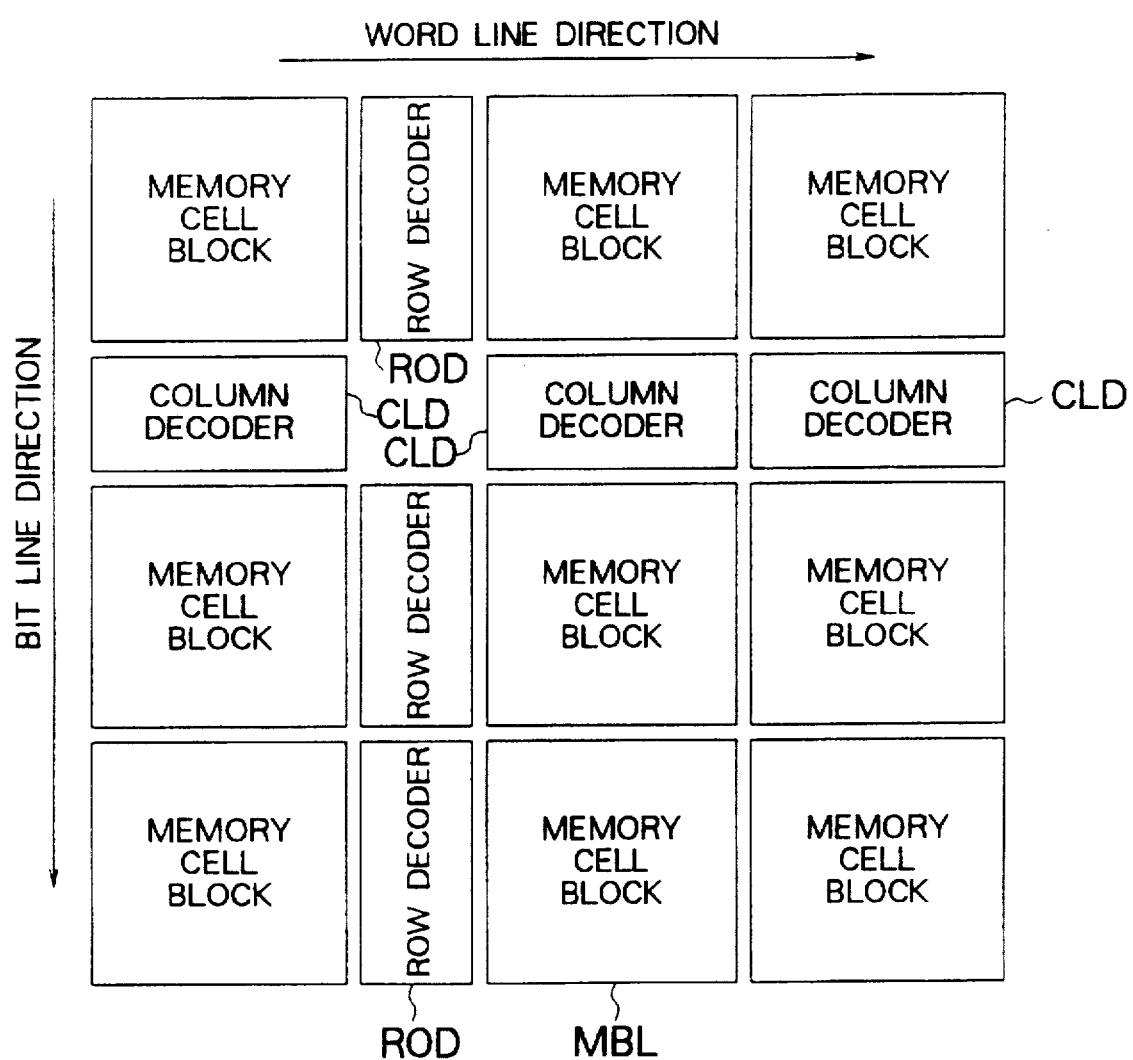
FIG. 21 is a block diagram of another embodiment of a flash memory circuit according to the present invention.

FIG. 21 is a block diagram of an embodiment of a flash memory circuit according to the present invention.

In FIG. 21, CLD indicates a column decoder, ROD a row decoder, and MBL a memory cell block.

In this embodiment, as shown in FIG. 21, the memory cells are divided into units of erasure blocks, a column decoder CLD is provided for each block MBL, and the write and the erasure are performed in units of column decoders.

In this configuration, the structure of the memory cells in one block MBL is for example that of an ordinary NOR type. Therefore, the number of transistors connected to one bit line in the memory cell is set to a range giving enough of a margin with respect to drain disturbance, for example, several hundred bits.

In such a configuration, the erasure operation can be realized by applying +20 V to the cell control gate, that is, word line, and 0 V to the source and drain, that is, bit line and base so as to inject electrons into the floating gate.

The write operation can be realized by applying −12 V to the cell control gate (word line) and 5 V to the drain (bit line) to draw out the electrons from the floating gate.

Further, cells which it is not desired to write in and present on the same control gate (word line) hold the drain (bit line) at 0 V, so the electric field between the floating gate and drain is reduced and the leakage of electrons from the floating gate no longer occurs.

In the read operation, the power source voltage $V_{cc}$ is applied to the control gate of the cell, +1 V to the drain (bit line), and 0 V to the source and base and the data "1" and "0" is judged based on if a cell current is flowing or not.

In this way, since the operations are performed in this embodiment in units of column decoders (bit line direction), there are the following advantages.

That is, for example in a NOR type flash memory having a floating gate, a large number (several k bits) of memory cell transistors are connected to a bit line. Therefore, when writing in a cell, drain disturbance occurred. This became a serious problem.

One means for avoiding this drain disturbance is the DINOR type memory cell structure where the bit line mentioned above is divided. In this structure, sub-bit lines are connected to the main bit lines and selection transistors separate the same.

Since only several dozen bits of memory cells are connected to sub-bit lines, there is a two-digit or so greater margin with respect to the problem of drain disturbance at the time of writing in the NOR type memory.

In the DINOR type flash memory, however, the bit lines are divided to form the sub-bit lines, so a further interconnection becomes necessary.

As opposed to this, in the circuit of the present embodiment, the memory cells can be formed without adding new interconnection layers. That is, it is possible to realize a memory cell structure enabling an improvement of the resistance to drain disturbance without newly adding interconnection layers.

This configuration can also be applied to the CHE write system.

As explained above, according to the present invention, it is possible to avoid the disadvantage of interband tunnel current which occurred in DINOR type semiconductor nonvolatile memory devices and AND type semiconductor nonvolatile memory devices, not increase the cell area as with a FLOTOX type EEPROM and ACEE type semiconductor nonvolatile memory device, and realize an NOR type semiconductor nonvolatile memory device of the FN/FN tunneling type of the complete single-transistor memory type.

According, there is the advantage that it is possible to realize a large capacity NOR type semiconductor nonvolatile memory device able to operate with a single power source.

Further, in this NOR type semiconductor nonvolatile memory device, it is possible to realize a memory cell structure enabling improvement of the drain disturbance resistance without adding any new interconnection layers.

What is claimed is:

1. A non-volatile flash memory unit comprising:

a plurality of memory cells, each comprising a charge storage device, arranged in an array having rows and columns; and a plurality of bit lines and a plurality of word lines connected to said memory cells;

wherein data is written to said memory unit by storing charges in said storage devices, said charges entering and leaving said charge storage devices by Fowler-Nordheim tunneling as said data is written and erased, respectively; and wherein, when data is erased from said memory unit, a negative voltage pulse is applied to a selected word line while all other word lines of said plurality of word lines are maintained at a reference voltage; and wherein, when data is erased from said memory unit, a positive voltage is applied to all of said plurality of bit lines.

2. A memory unit as claimed in claim 1, further comprising a power source for powering said memory unit which outputs a power source voltage;

wherein said positive voltage applied to all of said plurality of bit lines during an erase operation is said power source voltage.

3. A memory unit as claimed in claim 2, wherein said power source voltage is 3.3 volts.

4. A memory unit as claimed in claim 1, wherein said reference voltage is 0 volts.

5. A memory unit as claimed in claim 1, wherein:

each of said plurality of bit lines comprises a main bit line and a sub-bit line, said sub-bit line being connected through a switch to said main bit line, and each sub-bit line being connected to each memory cell in a column of said array.

6. A memory unit as claimed in claim 5, wherein said switches are a transistor.

7. A memory unit as claimed in claim 1, further comprising a main source line and a plurality of sub-source lines each of which is connected to said main source line through a switch, wherein each of said sub-source lines is connected to each memory cell in a column of said array.

8. A memory unit as claimed in claim 7, wherein said switches are transistors.

9. A memory unit as claimed in claim 1, wherein after an erase operation, a reference voltage, different from said positive voltage, is applied to all of said bit lines to verify said erase operation.

10. A memory unit as claimed in claim 1, wherein a block erasure operation is performed by successive erasing of a group of selected word lines all of which cross a common group of sub-bit lines, said group of selected word lines defining an erasure block.

* * * * *